United States Patent
Nauerth et al.

(10) Patent No.: US 11,169,238 B2
(45) Date of Patent: Nov. 9, 2021

(54) METHOD FOR DETERMINING MOTION STATES OF AT LEAST TWO BODIES AND METHOD FOR SIMULTANEOUSLY IMAGING AT LEAST TWO BODIES

(71) Applicant: Bruker BioSpin MRI GmbH, Ettlingen (DE)

(72) Inventors: Arno Nauerth, Erlenbach (DE); Michael Heidenreich, Karlsruhe (DE)

(73) Assignee: BRUKER BIOSPIN MRI GMBH, Ettlingen (DE)

( * ) Notice: Subject to any disclaimer, the term of this patent is extended or adjusted under 35 U.S.C. 154(b) by 494 days.

(21) Appl. No.: 16/168,040

(22) Filed: Oct. 23, 2018

(65) Prior Publication Data

US 2019/0128985 A1    May 2, 2019

(30) Foreign Application Priority Data

Oct. 24, 2017  (EP) .................................... 17198122

(51) Int. Cl.
*G01R 33/48* (2006.01)
*G01R 33/567* (2006.01)
(Continued)

(52) U.S. Cl.
CPC ..... *G01R 33/5676* (2013.01); *G01R 33/4828* (2013.01); *G01R 33/481* (2013.01); *G01R 33/4835* (2013.01); *G01R 33/5611* (2013.01)

(58) Field of Classification Search
CPC ............ G01R 33/5676; G01R 33/4828; G01R 33/481; G01R 33/5611; G01R 33/4835; G01R 33/56308; A61B 5/055
See application file for complete search history.

(56) References Cited

U.S. PATENT DOCUMENTS 9,551,771 B2 * 1/2017 Son .................. G01R 33/56509
9,977,106 B2   5/2018 Nehrke et al.
(Continued)

FOREIGN PATENT DOCUMENTS

CN    104081219 A    10/2014
CN    105247382 A    1/2016
(Continued)

OTHER PUBLICATIONS

Nieman et al., Review Article "MR technology for biological studies in mice", NMR in Biomedicine, May 2007; vol. 20, No. 3, pp. 291-303.
(Continued)

*Primary Examiner* — Joel Lamprecht
(74) *Attorney, Agent, or Firm* — Edell, Shapiro & Finnan LLC

(57) ABSTRACT

Techniques for determining motion states of at least two bodies by an MR-device are provided, wherein the bodies each have a respective target region which is in an anatomic motion comprising a repetitive motion pattern with a motion repetition rate, and in particular, for cardiac and/or respiratory motion. A sequence of individual MR-measurements are performed on the bodies at a MR-repetition rate higher than the motion-repetition rate, wherein nuclear spins of the at least two bodies are excited during the sequence of individual MR-measurements either simultaneously or alternately at navigator times. With the individual MR-measurements, navigator signals are determined, each respective navigator signal indicative of the motion state of at least one of the motion patterns at the navigator time of the navigator signal. These techniques allow simultaneously determining motion states for imaging more than one body with a repetitive motion pattern with reduced preparation time.

18 Claims, 14 Drawing Sheets

(51) Int. Cl.
G01R 33/561 (2006.01)
G01R 33/483 (2006.01)

(56) References Cited

U.S. PATENT DOCUMENTS

| | | | |
|---|---|---|---|
| 10,274,569 B2 | 4/2019 | Chen et al. | |
| 2007/0038071 A1* | 2/2007 | Nauerth | G01R 33/5676 600/410 |
| 2015/0355302 A1 | 12/2015 | Fischer et al. | |

FOREIGN PATENT DOCUMENTS

| | | |
|---|---|---|
| CN | 105301537 A | 2/2016 |
| CN | 106539584 A | 3/2017 |
| DE | 10 2005 030 162 B3 | 4/2007 |

OTHER PUBLICATIONS

Nehrke et al., "Advanced Navigator Techniques", International Journal of Bioelectromagnetism, Sep. 2000, vol. 2, No. 2, 8 pages.

Dasari et al., "MRI Investigation of the Linkage Between Respiratory Motion of the Heart and Markers on Patient's Abdomen and Chest . . . ", IEEE Transactions on Nuclear Science, vol. 61, No. 1, Jan. 2014, 10 pages.

Esparza-Coss et al., "Wireless Self-Gated Multiple-Mouse Cardiac Cine MRI", Magnetic Resonance in Medicine, Apr. 2008, vol. 59, No. 5: pp. 1203-1205.

Manber et al., "Practical Pet Respiratory Motion Correction in Clinical Simultaneous PET/MR", Apr. 2015, IEEE 12th International Symposium on Biomedical Imaging, pp. 1580-1583.

\* cited by examiner

METHOD FOR DETERMINING MOTION STATES OF AT LEAST TWO BODIES AND METHOD FOR SIMULTANEOUSLY IMAGING AT LEAST TWO BODIES

CROSS REFERENCE TO RELATED APPLICATIONS

This application claims foreign priority under 35 U.S.C. § 119(a)-(d) to European Application No. EP 17198122.8 filed on Oct. 24, 2017, the entire contents of which are hereby incorporated into the present application by reference.

FIELD OF THE INVENTION

An aspect of the invention concerns a method for determining motion states of at least two bodies.

Another aspect of the invention concerns a method for simultaneously imaging at least two bodies, the bodies each having a respective target region, which is in an anatomic motion, the anatomic motion comprising a repetitive motion pattern with a motion repetition rate, in particular a cardiac and/or respiratory motion.

BACKGROUND

Imaging methods, such as MRI (magnetic resonance imaging), PET (positron emission tomography), CT (computed tomography), etc. require image reconstruction using image data acquired during an acquisition period. Imaging of living bodies is difficult, since motion of the body or parts of the body (in particular cardiac or respiratory motion) may reduce the quality of the images.

Imaging methods according to the state of the art therefore determine the motion states of the bodies. The reconstruction is carried out by using image data, which have been acquired during one or more motion state(s) of interest. The conventional MR imaging technique with respiratory gating and cardiac triggering can only be applied for a single animal. Thus, a multitude of animals can only be retrospectively reconstructed. Conventional retrospective reconstruction on a multitude of animals would require the recording of the physiological signals in parallel to the data acquisition. However, the cabling and especially attaching of the ECG electrodes to each of the animals is very time consuming and prone to errors and malfunctions.

DE 10 2005 030 162 B3 discloses a method for generating MR (magnetic resonance) images of an object with a repetitive motion pattern by using navigator signals acquired by an MR-device. Yet, the navigator signals as described in DE 10 2005 030 162 B3 do not distinguish between different bodies. Thus, the known method is not applicable on a plurality of bodies.

SUMMARY

It is an object of the invention to provide a method for simultaneously determining motion states for imaging more than one body with a repetitive motion pattern with reduced preparation time and reduced probability of failure.

This object is achieved and claimed and described below. According to an aspect of the invention, the motion states of the at least two bodies are determined by an MR-device. Aspects of the inventive method include the following:
performing a sequence of individual MR-measurements on the bodies at a MR-repetition rate higher than the motion-repetition rate, wherein nuclear spins of the bodies are excited during the sequence of individual MR-measurements either simultaneously or alternately at navigator times;
for each of the individual MR-measurements: determining navigator signals, each navigator signal indicating the motion state of at least one of the motion patterns at the navigator time of the navigator signal; and
determining the motion states of the at least two bodies by analyzing the navigator signals.

The bodies are preferably living organisms, e.g. mice, rats or human patients. According to aspects of the invention, the bodies comprise target regions to be imaged, in which flow and/or motion takes place (e.g. cardiac motion due to heartbeat, blood flow or respiratory motion due to breathing). Thus, objects (e.g. organs or blood) within the target region are moving relative to other elements within the target region, while the bodies as a whole may remain essentially stationary. The anatomic motions show repetitive motion patterns with recurrent motion phases (e.g. systole, diastole, inhalation, exhalation) or a superimposition of several repetitive motion patterns (e.g. superimposition of cardiac and respiratory motion). Typical motion-repetition rates are 10-100 respirations per minute (mice/rats: ca. 50, humans: ca. 15 respirations per minute) and 30-600 heartbeats per minute (mice: ca. 500, rats: 350, humans: ca. 60, newts: ca. 40 heartbeats per minute). The frequencies with which the motion patterns are repeated and the amplitudes of the motions may vary, i.e. the motions do not need to be exactly periodic.

A motion state may comprise a snapshot of the motion (e.g. end systole, end diastole, breathing space), but can also comprise a longer part of a motion phase (comprising more than only one single snapshot of the motion).

The navigator signals are acquired from navigator-regions of the bodies. The navigator regions may correspond to the target regions, but can also be different from the target regions as long as the motion of the target region influences the navigator signal and the navigator signal is indicative for the motion state of the motion pattern of the target region. Thus, the dynamics associated with the target region are recorded by the navigator signal.

The navigator signal is a contiguous region of time-sequential data points of an MR-signal acquired during an individual MR-measurement. During the sequence of individual MR-measurements, the nuclear spins of each body are excited repeatedly. An individual MR-measurement comprises a gradient sequence, excitation, spatial encoding (optional), and detection/reading. Typical MR-repetition rates to be applied are 2000-15000 measurements per minute.

Navigator signals of a sequence of individual MR-measurements are determined during the same encoding state (i.e. by applying the same gradient sequence during each individual measurement, in which navigator signals are determined).

Motion states of the body target region can be determined by analyzing the navigator signal.

Aspects of the inventive method allow the determination of motion states of a multitude of bodies simultaneously with a minimum of preparation time for the bodies.

The navigator signals for the different bodies can be determined using different receiving coils. By using separate receiving coils, in particular surface coils, for the different bodies (e.g. a coil array), separate navigator-signals can be determined for different bodies. The receiving coils are positioned such that one receiving coil detects MR-signals from one of the bodies and another receiving coil detects MR-signals from another body. Nuclear spins of both bodies can be excited simultaneously, e.g. by applying a hard pulse or a slice selective pulse, wherein the slice selection gradient is chosen such that the slice crosses both bodies. The slice selection gradient is applied prior to detection of the navigator signal. By applying a slice section gradient, a suitable area (navigator volume) of the body for generating the navigator can be chosen, which is most sufficiently significant for the motion of the target region. The navigator volume does not necessarily contain parts of the target region (e.g. heart or lung of the body), but can be a part of the body which is influenced by the motion pattern (e.g. a cross section of an artery) of the target region. Applying a slice section gradient requires a longer time but provides an additional degree of freedom.

Thus, motion states for several bodies can be determined simultaneously. In case no slice selection is applied (hard pulse), a broadband signal can be detected due to the short duration of the MR-individual measurements. Yet, if a hard pulse is used, surface coils should be used for determining motion states of torque-free motions (e.g. heartbeat).

In a preferred variant the navigator signals for the at least two bodies are detected using a common receiving coil. In this case, it has to be determined, which navigator signal (or which part of the navigator signal) is indicative for the motion of which body. In this respect, according to aspects of the invention, several possible variants are provided, as will be described as follows.

In a highly preferred variant a read gradient is applied with the individual MR-measurements and at least two of the bodies are separated along the direction of the read gradient. Nuclear spins of bodies, which are separated from each other along the direction of the read gradient, may be excited at the same navigator time. Different frequency components of the navigator signal can be assigned to the bodies, which are separated along the direction of the read gradient. Thus, spatial resolution of the navigator signal along the direction of the read gradient can be achieved within only one individual MR-measurement (only one excitation pulse has to be applied to acquire a navigator signal for several bodies). Thus, the motion states for several bodies can be determined for the same navigator time.

Alternatively or in addition to, a slice selection gradient can applied with the individual MR-measurements, wherein at least two of the bodies are offset along the direction of the slice selection gradient, and wherein for each of the offset bodies an individual MR-measurement is carried out. The slice selection gradients of the individual MR-measurements are chosen such that at any navigator time nuclear spins of only one of the two offset bodies are excited. Navigator signals for the bodies, which are offset in a direction of the slice selection gradient, are acquired by obtaining different (successive) individual MR-measurements and thus, at different navigator times.

In order to assign each navigator signal to one of the offset bodies, the offset bodies do not necessarily need to be separated in the direction of the slice selection gradient but may also overlap in the direction of the slice selection gradient to some extent. Yet, in this case, it is necessary to ensure either that the bodies are displaced in a direction of a read gradient or that the selected slice does not cross both bodies simultaneously.

A highly preferred variant combines applying a slice selection gradient prior to acquisition of the navigator signal (s) and applying a read gradient during acquisition of the navigator signal(s), whereby the slice selection gradient and the read gradient have different directions, and in particular, are perpendicular to each other. While the nuclear spins of only one body of a set of offset bodies, which are shifted relative to each other along the direction of the slice selection gradient, are excited, nuclear spins of several bodies of another set of bodies, which are separated from each other along the direction of the read gradient, can be excited at the same navigator time.

It is highly preferred that the individual MR-measurements for determining navigator signals for one of the offset bodies and individual MR-measurements for determining navigator signals for another one of the offset bodies are carried out alternately. Thus, the repetition time TR for the MR-measurements for a specific body is longer compared to determining a navigator signal for only one body.

The direction of the slice selection gradients may be different for individual MR-measurements concerning different bodies. In this case, it might be necessary to adapt the direction of the read gradient (if applied) accordingly.

In a preferred variant the direction of the slice selection gradient is different to the direction of the read gradient, in particular, perpendicular to the direction of the read gradient. Thereby, detection of navigator signals, which are spatially resolved in two directions, is realized. Thus, the navigator signals give information about the motion of target regions at different positions along the direction of the read gradient and/or the slice selection gradient or about different bodies at different positions along the direction of the read gradient and/or the slice selection gradient.

The navigator signal can be part of a Free Induction Decay (FID). Specifically, the navigator signal comprises a partial region of the MR-signal without gradients, with the nuclear spin system rephased in this partial region.

Alternatively the navigator signal can be an MR-echo-signal or part of a MR-echo-signal.

Aspects of the invention also concern a method for simultaneously imaging at least two bodies, the bodies each having a respective target region which is in an anatomic motion comprising a repetitive motion pattern with a motion repetition rate, the method comprising the steps of:
  acquiring image-data of the bodies by performing image-measurements on the bodies during an acquisition period;
  determining motion states of the bodies using the aforedescribed method, wherein the sequence of individual MR-measurements is carried out during the acquisition period;
  assigning the determined motion states to image-data determined at the navigator times; and
  performing reconstruction of one or more images from selected image-data showing one or more selected motion states.

Image-data of the bodies are acquired by carrying out imaging-measurements at acquisition times (points in time of the acquisition period). According to aspects of the invention, the motion states are assigned to acquisition times (and thereby are assigned to image data acquired at the acquisition times). Therefore, the navigator signals for the bodies are acquired within the duration of the same acquisition period. The assignment is realized using MR-data (more precisely using the navigator signals) obtained from the sequence of individual MR-measurements, as described above. An assignment takes place in case the acquisition time corresponds to the navigator time (plus/minus a specific interval).

In general, the motion pattern (sequence of motion phases) of the anatomic motion is known. If the navigator signal does not comply with the expected motion pattern, the navigator can be discarded and no assignment to the image-data is carried out for the corresponding navigator time (point in time at which the respective individual MR-measurements are performed (time of excitation)).

In a special variant the acquired image data comprise PET-data and PET-images are generated. Information concerning the navigator times and the assigned motion states is sent to the PET-device. PET-data, acquired at the navigator times (plus a specific interval, if desired) are linked with the corresponding motion state, e.g. by assigning an index (which is indicative for the motion state) to the PET-data. Now PET-images can be generated by selecting PET-data, which are linked to the same motion state or to selected motion states (predetermined motion states of interest), for PET-image reconstruction.

Since PET-data are acquired continuously during the acquisition period while navigator signals are only obtained at the MR-repetition rate (in general one navigator for each individual measurement) only a fraction of the PET-data is acquired at navigator times. Thus, only a fraction of the acquired PET-data can be used for direct assignment of motion states to PET-data. Therefore, in a special variant of the inventive method, an interpolation between two sequential navigator times is carried out for determining an additional motion state for a point in time between the two sequential navigator times. Thus, a higher temporal resolution can be obtained (provided that the motion pattern is known).

In another variant a motion state is assigned to several sequential acquisition times. This variant can be applied e.g. during a breathing space in which a multitude of PET-data are acquired at several sequential acquisition times. By assigning a motion state to several sequential acquisition times, a higher number of data contribute to the PET-image, thus improving signal to noise (S/N)-ratio.

In another special variant the acquired image data comprise MM-data and MM-images are generated.

BRIEF DESCRIPTION OF THE DRAWINGS

FIG. 2A shows an aspect using surface coils, FIG. 2B shows an aspect using surface coils with navigator volumes, and FIG. 2C shows an aspect using volume coils.

FIG. 4A applies a hard pulse and acquires a navigator signal; FIG. 4B applies a hard pulse and acquires a navigator echo; and FIG. 4C applies a specially tailored RF pulse instead of a hard pulse.

FIG. 5A and FIG. 5B use pulse and gradient sequences respectively without and with navigator volumes.

FIG. 7A shows a first pulse and gradient sequence and FIG. 7B shows a second pulse and gradient sequence.

FIG. 14A shows a first arrangement of two bodies, and FIG. 14B shows a second arrangement of two bodies. In FIG. 14C, two navigator signals are acquired for determining the motion states of four bodies M1, M2, M3, M4.

DETAILED DESCRIPTION

Figure 1:
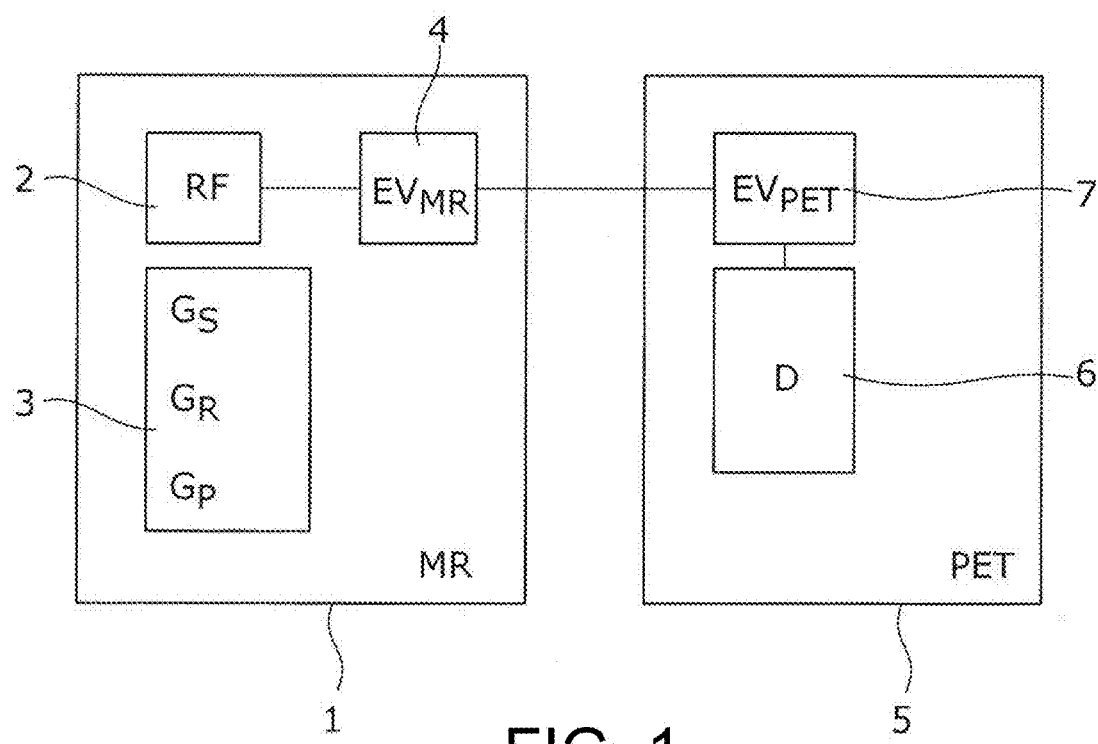
FIG. 1 shows a schematic diagram of the components for a combined PET imaging and a MR-device for carrying out a method according to aspects of the invention.

Aspects of the inventive method for determining motion states can be used in combination with imaging methods, such as MRI or PET. In both cases an MR-device 1 is required for determining the motion states. The MR-device 1 which comprises an RF-system 2, a gradient-system 3 and an evaluation unit 4. For other imaging methods, such as PET, CT a further imaging device 5 is provided.

In the case of combining aspects of the inventive method for determining motion states with MR-imaging, the information concerning the motion states of the bodies at navigator times and the image data are processed within the evaluation unit 4 of the MR-device 1.

In the case of combining aspects of the inventive method for determining motion states with PET-imaging the information concerning the motion states of the bodies at navigator times and the image data detected by a PET-detector 6 are sent to a further evaluation unit 7 of the PET-device 5, as shown in FIG. 1.

Using the MR-device navigator signals are determined, which are indicative for the motion state of a motion pattern of several bodies (more precisely of target regions of the bodies) to be examined (e.g. to be imaged). A gradient pulse sequence is applied to the bodies by the gradient system 3. Nuclear spins of navigator volumes of the bodies (two or more) are excited by applying one or more excitation pulses by the RF-system 2 within the same gradient pulse sequence. In order to determine a navigator signal, a responsive MR-signal is detected by the RF-system 2 of the MR-device 1. The navigator signals are analysed by the evaluation unit 4, thereby determining the motion states of the target regions of the bodies. The determined motion states are related to navigator times (times at which nuclear spins of at least one of the bodies have been exited). For image reconstruction, image-data detected at acquisition times within an acquisition period are linked with the motion states which correspond to the acquisition times of the image-data (acquisition time of image-data and navigator time of motion state are in the same time interval) by the evaluation unit 4. Image-data corresponding to a motion state of interest (e.g. breathing pause) can now be selected for image reconstruction. The gradient system 3 of the MR-device 1 allows distinguishing between different bodies within the imaging volume of the MR-device 1. Depending on the coil arrangement and the applied gradient sequence, different arrangements of bodies can be simultaneously imaged by the image-device while motion states of bodies are determined independently and in parallel to the image-data.

Figure 2A:
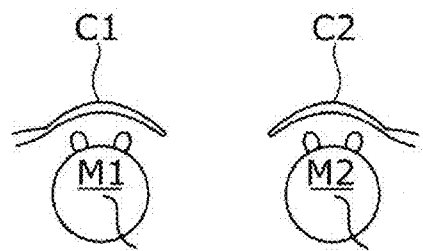
FIGS. 2A-C show different variants of the inventive method by using separate receiving coils for a set of bodies, where
Figure 2B:
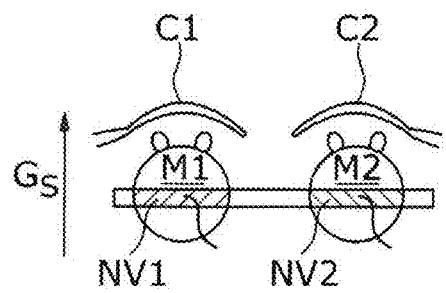
Figure 2C:
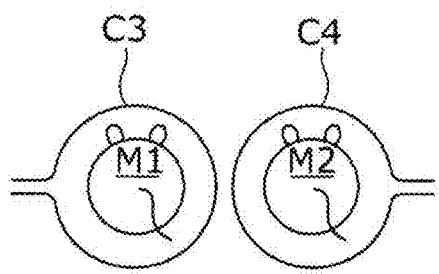
Figure 4A:
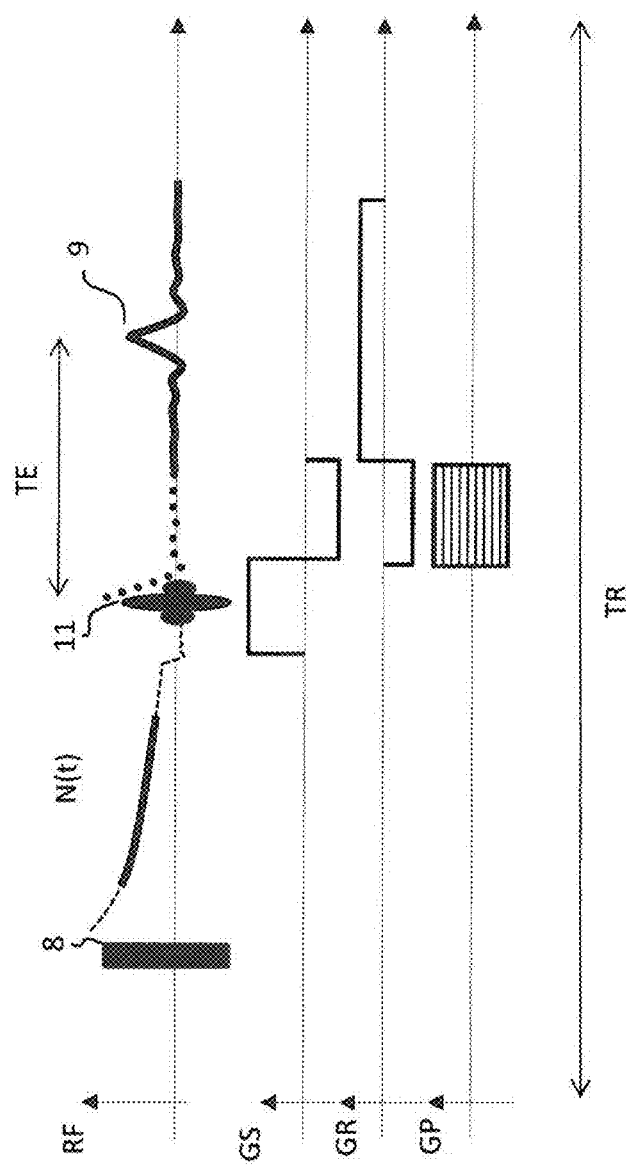
FIGS. 4A-4C show respective pulse sequences to be repeated to form the sequence of individual measurements for determining the navigator signals shown in FIG. 3 and for acquiring MR-image data.

FIGS. 2A-C show variants of the inventive method, in which each body M1, M2 is equipped with a separate receiving coil C1, C2, C3, C4 for receiving MR-signals. For receiving the MR-signals, surface coils C1, C2 (as shown in FIGS. 2A and 2B) or volume coils C3, C4 (as shown in FIG. 2C) can be used. From the detected MR-signals, navigator signals $N1(t)$, $N2(t)$ are determined by carrying out first individual MR-measurements. By providing separate coils for each body M1, M2, navigator signals $N1(t)$, $N2(t)$ for each body can be determined simultaneously. In FIG. 2A and FIG. 2C the navigator signals $N1(t)$, $N2(t)$ are acquired from the whole bodies (nuclear spins of the whole bodies have been excited by a hard pulse 8 (see FIGS. 4A-4B)). In FIG. 4A a part of a FID 9' is acquired as navigator signal $N(t)$. In case of a navigator echo (FIG. 4B), a more sophisticated determination of the physiological signals can be applied. If a special (restricted) area of the body (navigator volumes NV1, NV2) shall be selected (as shown in FIG. 2B) for exciting nuclear spins, a slice selection gradient $G_S$ in combination with a specially tailored RF-pulse 10 can be applied (see FIG. 4C) instead of the hard pulse 8.

Figure 3:
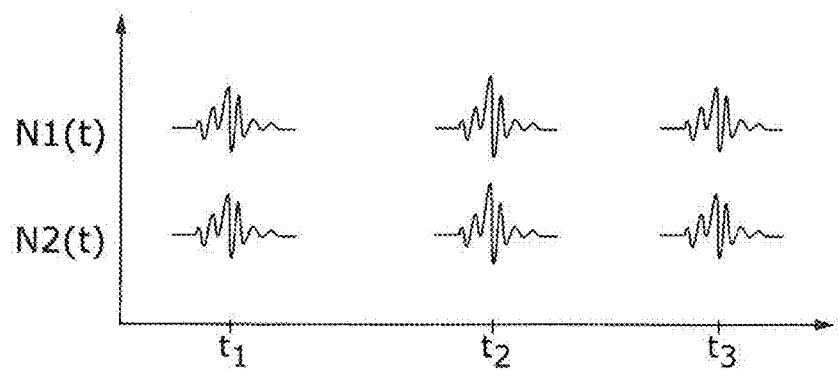
FIG. 3 shows the navigator signals and the motion states determined from the navigator signals by performing the variants shown in FIGS. 2A-C.

FIG. 3 shows the navigator signals $N1(t)$, $N2(t)$ for both bodies M1, M2 shown in FIGS. 2A-2C at three navigator times $t_1, t_2, t_3$. It can be seen, that for each navigator time $t_1$, $t_2, t_3$ two navigator signals (one for each body) are determined.

Figure 4B:
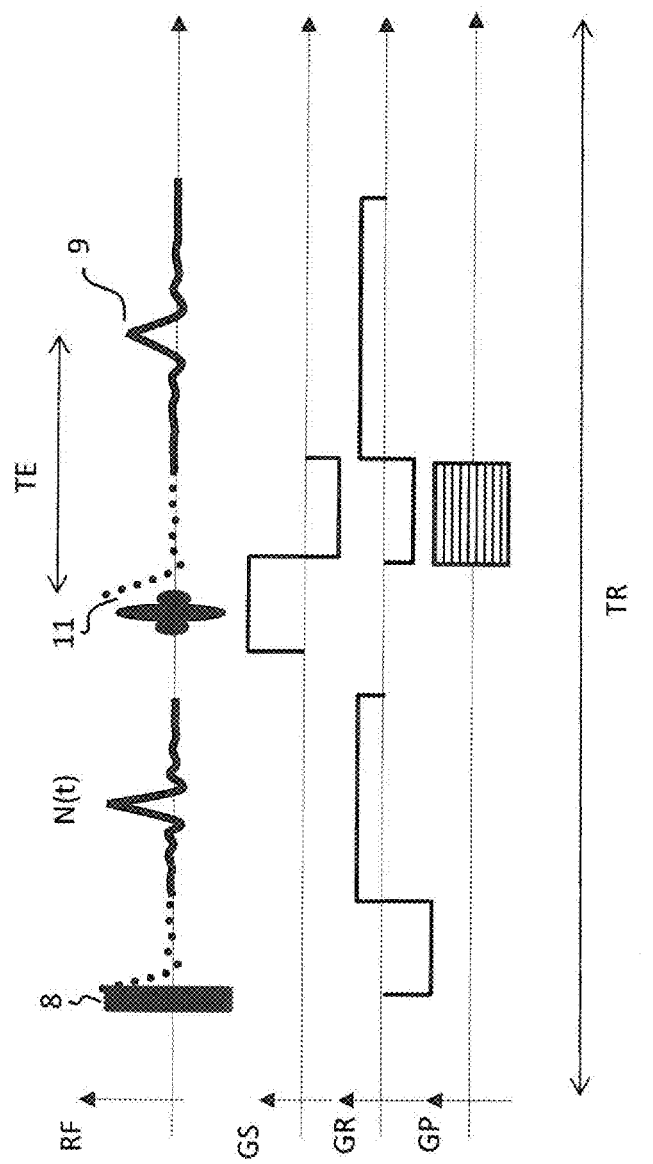
Figure 4C:
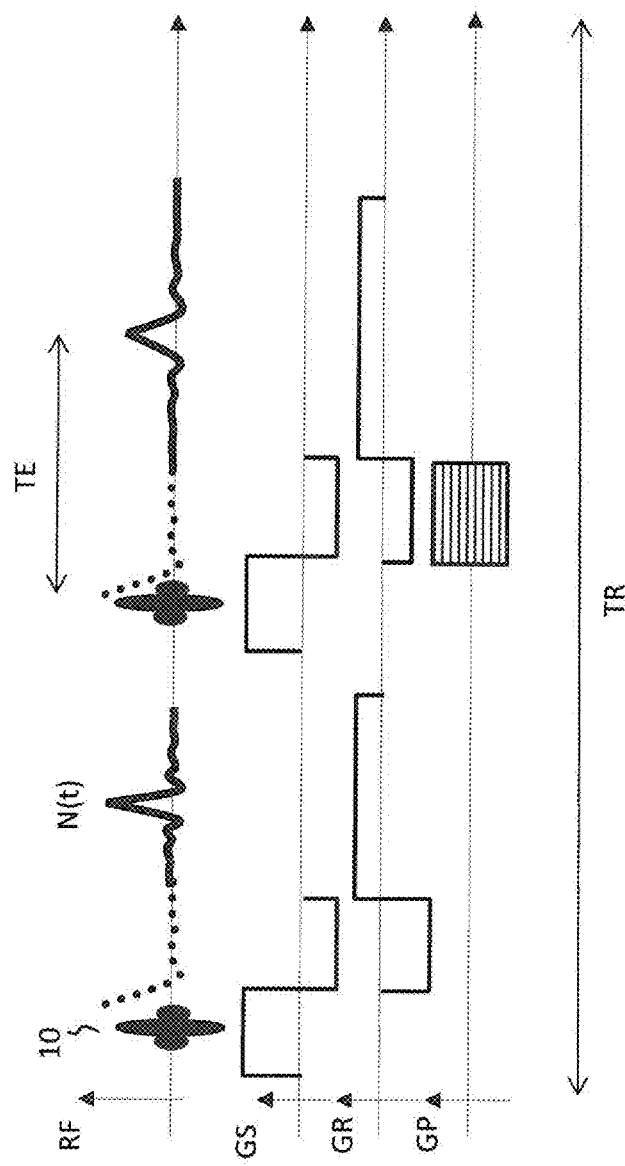

For the variants shown in FIGS. 2A and 2C a sequence of individual MR measurements can be used in which a pulse and gradient sequence according to FIGS. 4A-4B is repeated. For the variant shown in FIG. 2B a sequence of individual MR measurements can be used in which a pulse and gradient sequence according to FIG. 4C is repeated. All gradient sequences comprise a first individual measurement for acquiring the navigator signals and a second individual measurement for acquiring image data 9. For acquiring image data from a target region which is different from the navigator volume a second individual MR measurement is carried out during the repetition time TR for acquiring MR-image data.

Figure 5A:
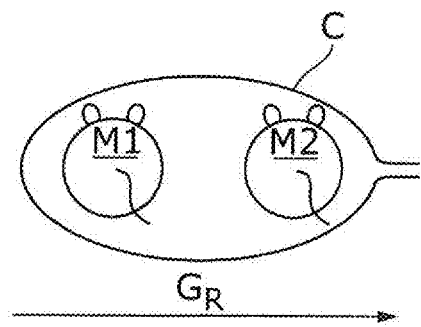
FIGS. 5A-B show variants of the inventive method using a common receiving coil for a set of bodies separated in a direction of a read gradient.
Figure 5B:
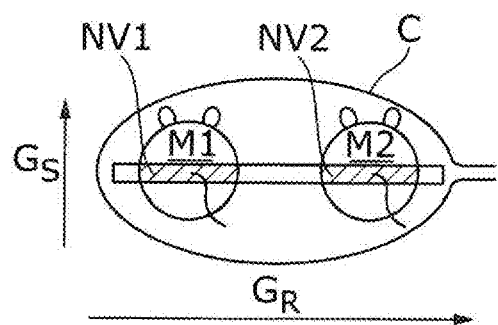
Figure 6:
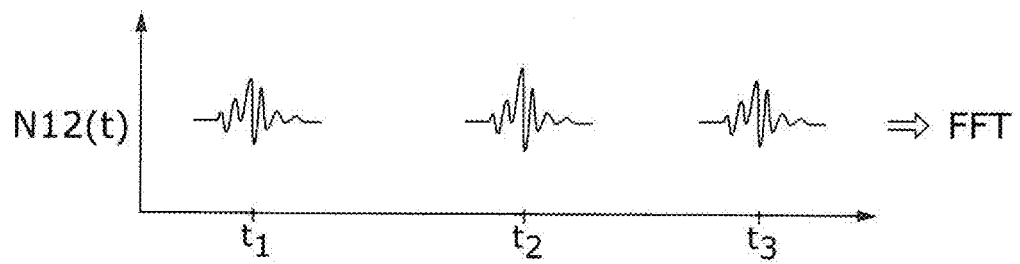
FIG. 6 shows the navigator signals determined from the navigator signals by performing the variants shown in FIGS. 5A-B.
Figure 11:
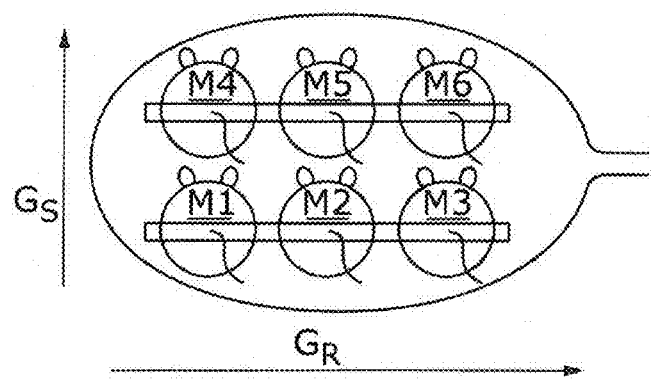
FIG. 11 shows a highly preferred variant of the inventive method using a common receiving coil for a set of bodies offset in a direction of a slice selection gradient and a set of bodies separated in a direction of a read gradient.

In order to reduce material input, it is preferred to use only common receiving coil(s) C for a multitude of bodies M1, M2, M3, M4, M5, M6 as shown in FIG. 11. In order to ensure that motion states of different bodies M1, M2, M3, M4, M5, M6 can be distinguished while using only one single common receiving coil C, different variants of the inventive method can be applied which are described in the following:

FIGS. 5A and 5B show first variants using a common receiving coil C. In order to distinguish the motion states of the different bodies M1, M2 a read gradient $G_R$ is applied in a direction in which the bodies M1, M2 are separated from each other. A single navigator signal $N12(t)$ is determined while the read gradient $G_R$ is applied. The navigator signal $N12(t)$ is indicative for the motion states of both bodies M1, M2. Using a frequency analysis FFT, the navigator signal $N12(t)$ can be split into frequency components. The frequency components can be assigned to the location of the different bodies M1, M2. Thus, at each navigator time $t_1, t_2$, $t_3$ one navigator signal $N12(t)$ which is indicative for the motion state of both bodies M1, M2 is determined, as shown in FIG. 6. In addition to the applied read gradient $G_R$ a slice selection gradient $G_S$ in combination with a specially tailored RF-pulse 10 can be applied simultaneously in order to select navigator volumes NV1, NV2, from which the navigator signal $N12(t)$ shall be determined (see FIG. 5B).

Figure 7A:
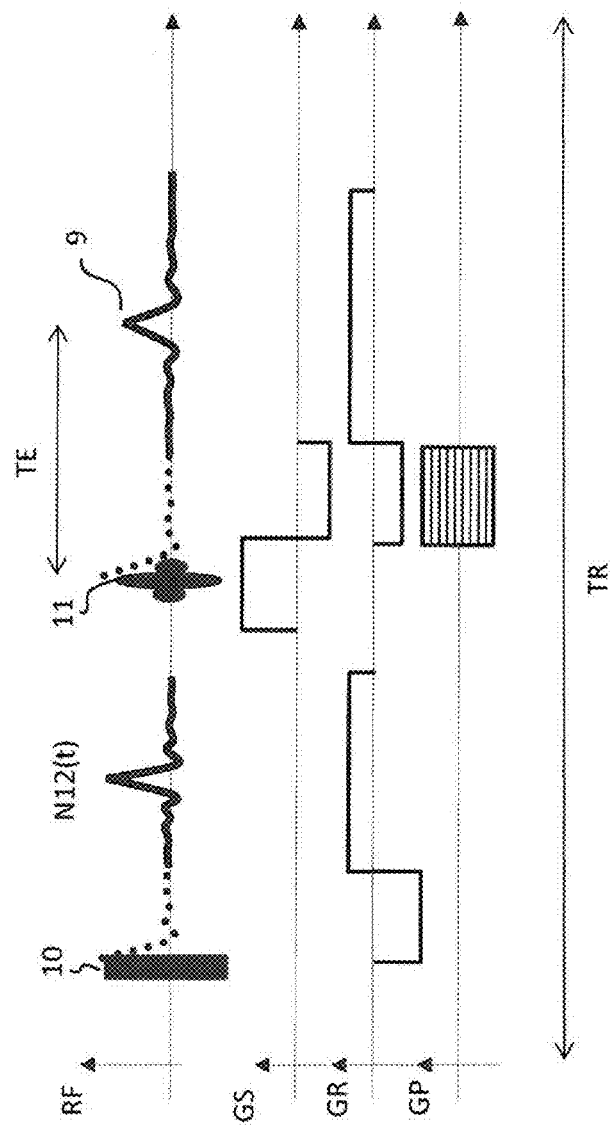
FIGS. 7A-B show respective pulse sequences to be repeated to form the sequence of individual measurements for determining the navigator signals shown in FIG. 6 and for acquiring MR-image data.
Figure 7B:
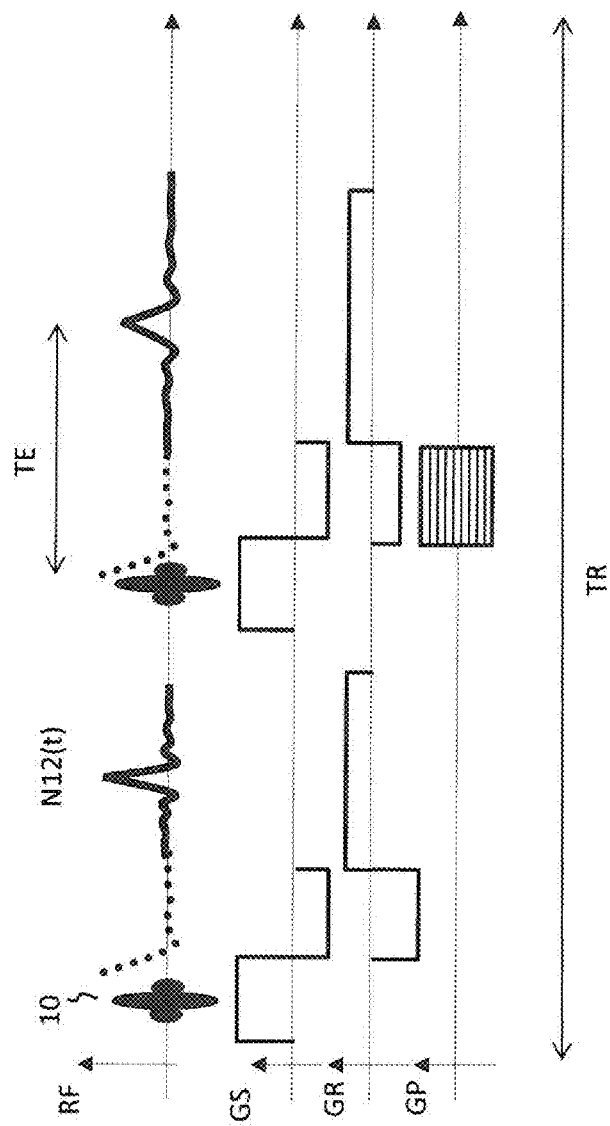

For the variant shown in FIG. 5A a sequence of individual MR measurements can be used in which a pulse and gradient sequence according to FIG. 7A is repeated. For the variant shown in FIG. 5B a sequence of individual MR measurements can be used in which a pulse and gradient sequence according to FIG. 7B is repeated. Both gradient sequences comprise a first individual measurement for acquiring the navigator signals and a second individual measurement for acquiring image data 9.

Figure 8A:
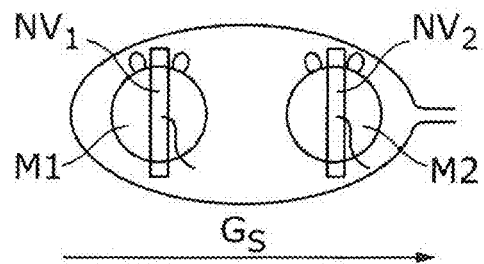
FIGS. 8A-B show variants of the inventive method using a common receiving coil for a set of bodies offset in a direction of a slice selection gradient. A slice selection gradient $G_S$ is applied in the direction in which the bodies M1, M2 are separated from each other (FIG. 8A) or at least offset (shifted) with respect to each other (FIG. 8B).
Figure 8B:
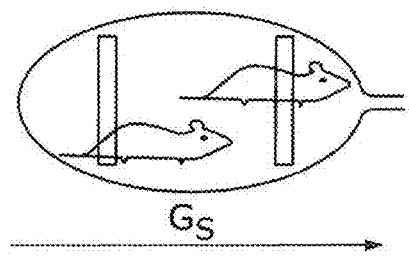
Figure 9:
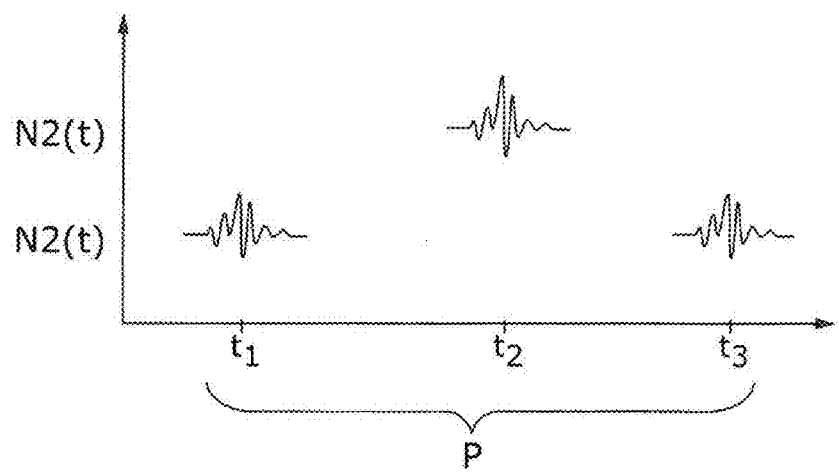
FIG. 9 shows the navigator signals determined from the navigator signals by performing the variants shown in FIGS. 8A-B.

Another possibility to distinguish the motion states of the bodies M1, M2 is shown in FIGS. 8A and 8B. A slice selection gradient $G_S$ is applied in the direction, in which the bodies M1, M2 are separated from each other (FIG. 8A) or at least offset (shifted with respect to each other as shown in FIG. 8B). In this case, two consecutively performed individual MR-measurements are carried out, wherein different navigator volumes NV1, NV2 are selected by applying different excitation pulses 10, 10' while applying a slice selection gradient $G_S$. Thus, nuclear spins of the single bodies M1, M2 can be excited alternately, resulting in navigator signals $N1(t)$, $N2(t)$ each being indicative for the motion state of only one of the offset bodies M1, M2. At each navigator time $t_1, t_2, t_3$, a navigator signal for only one of the bodies M1, M2 can be determined, as shown in FIG. 9. Since the navigator signals $N1(t)$, $N2(t)$ are determined alternately, motion states for both bodies M1, M2 can be determined within an acquisition period P.

Figure 10:
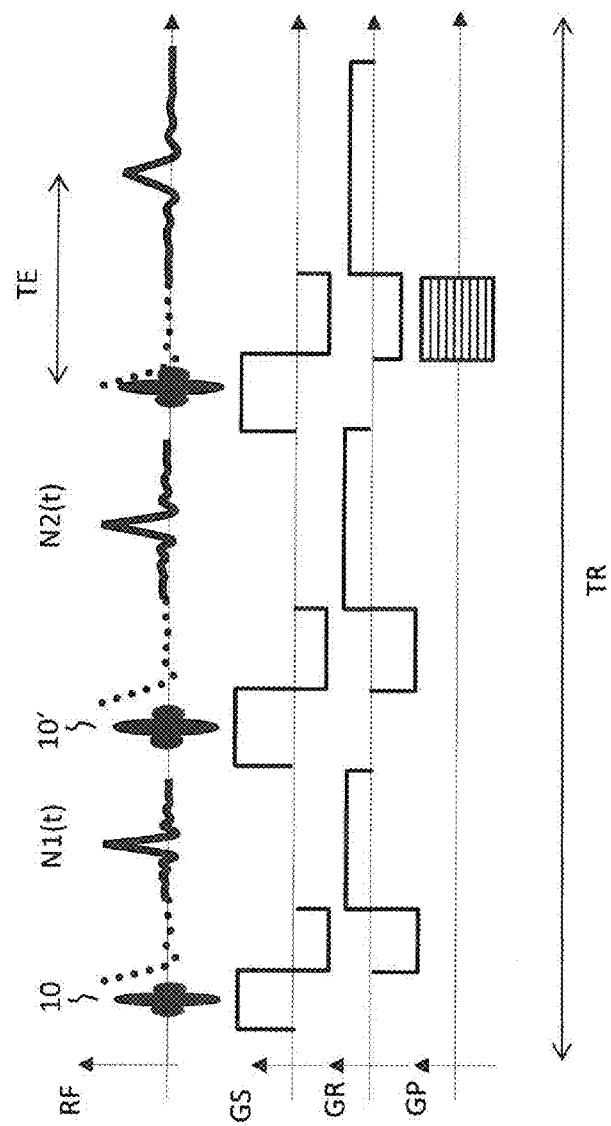
FIG. 10 shows a pulse sequence to be repeated to form the sequence of individual measurements for determining the navigator signals shown in FIG. 9 and for acquiring MR-image data.

For the variant shown in FIGS. 8A and 8B a sequence of individual MR measurements can be used in which a pulse and gradient sequence according to FIG. 10 is repeated. The pulse and gradient sequence according to FIG. 10 comprise two first individual measurements for acquiring the navigator signals and a second individual measurement for acquiring image data 9.

While the examples discussed so far examine only bodies separated or offset in one direction, the inventive method can also be used for determining motion states of a multitude of bodies M1, M2, M3, M4, M5, M6 which are separated/offset in different directions as will be explained in the following:

FIG. 11 shows two first sets of bodies M1-M2-M3, M4-M5-M6, which are separated from each other in a first direction and three second sets of bodies M1-M4, M2-M5, M3-M6, which are separated in a second direction. In order to distinguish the motion states of the single bodies M1, M2, M3, M4, M5, M6, a read gradient $G_R$ as well as a slice selection gradient $G_S$ is applied, wherein the slice selection gradient G_S is applied in a direction in which the first set of bodies M1-M2-M3 is separated from the other first set of bodies M4-M5-M6 and the read gradient G_R is applied in direction in which the second sets of bodies M1-M4, M2-M5, M3-M6 are separated from each other (or at least offset, i.e. the bodies do not necessarily need to be separated in the direction of the slice selection gradient, but may also overlap in the direction of the slice selection gradient to some extent as long as the non-overlapping regions reflect the motion states).

Figure 12:
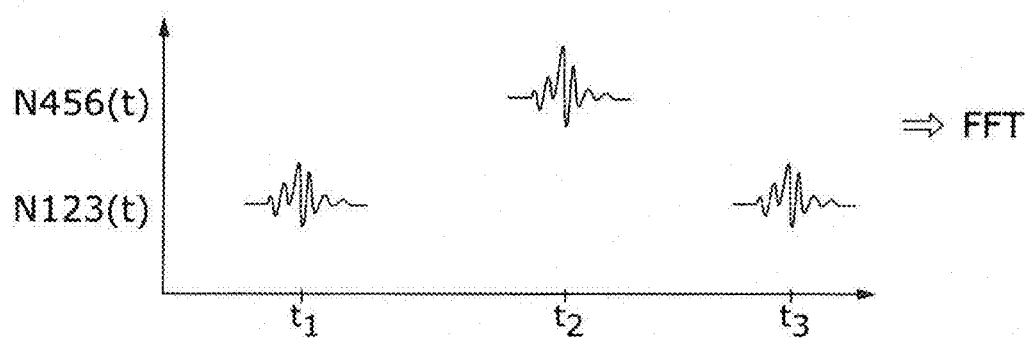
FIG. 12 shows the navigator signals by performing the variant shown in FIG. 11.

Navigator signals N123(t), N456(t) are determined alternately (as described in the discussion of FIGS. 8A and 8B), wherein the navigator signal N123(t) is a common navigator signal for the first set of bodies M1-M2-M3 and the navigator signal N456(t) is a common navigator signal for the other first set of bodies M4-M5-M6, as shown in FIG. 12. Using frequency analysis the frequency components of the navigator signals N123(t), N456(t) of the respective first set of bodies M1-M2-M3, M4-M5-M6 can be separated due to the read gradient which has been applied during detection of the MR-signal. The number of frequencies regions, in which the navigator-signals N123(t), N456(t) is split, depends on the number of bodies within each first set of bodies M1-M2-M3, M4-M5-M6 (here: three). The number of individual measurements to be carried out for acquiring the navigator-signals N123(t), N456(t) depends on the number of bodies of each second set of bodies M1-M4, M2-M5, M3-M6 (here: two).

Figure 13:
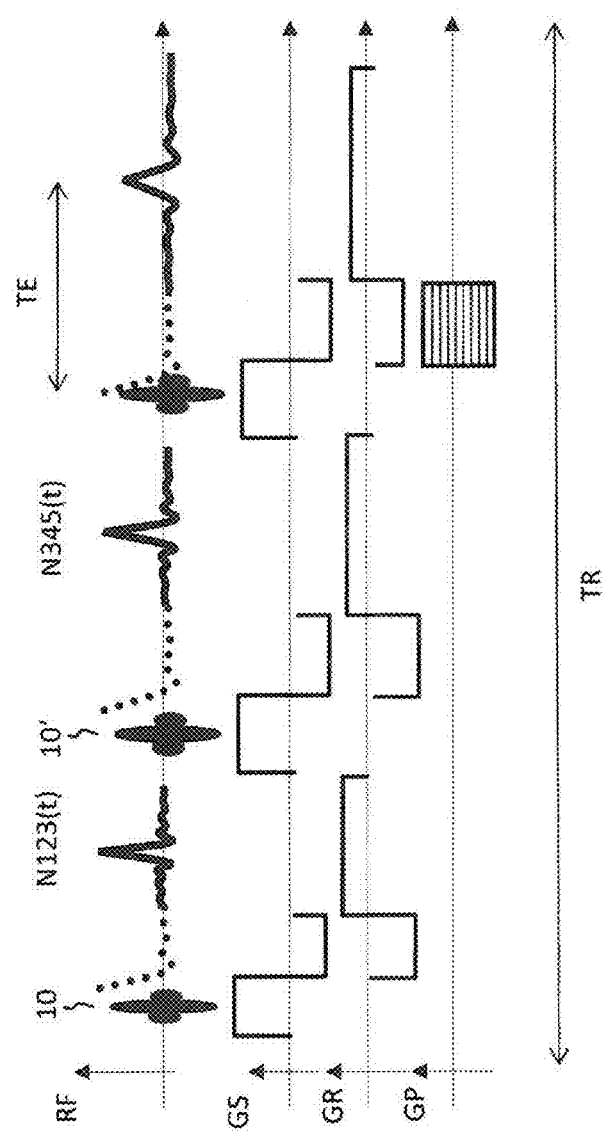
FIG. 13 shows a pulse sequence to be repeated to form the sequence of individual measurements for determining the navigator signals shown in FIG. 12 and for acquiring MR-image data.

For the variant shown in FIG. 11 a sequence of individual MR measurements can be used in which a pulse and gradient sequence according to FIG. 13 is repeated. The pulse and gradient sequence according to FIG. 13 comprise two first individual measurements for acquiring the navigator signals and a second individual measurement for acquiring image data 9.

Figure 14A:
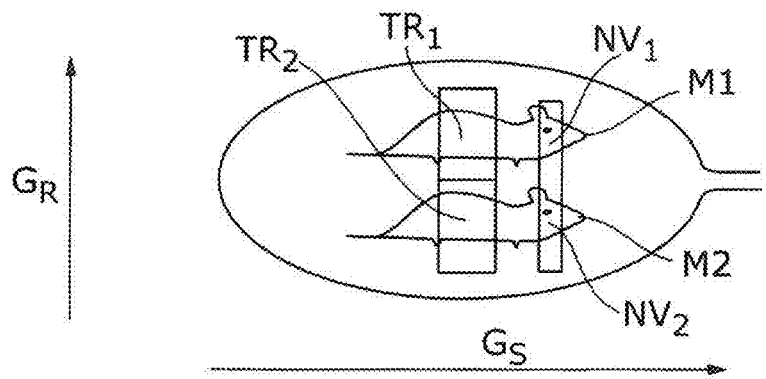
FIGS. 14A-C show arrangements of bodies and the corresponding target regions and navigator volumes, which differ from the target regions.
Figure 14B:
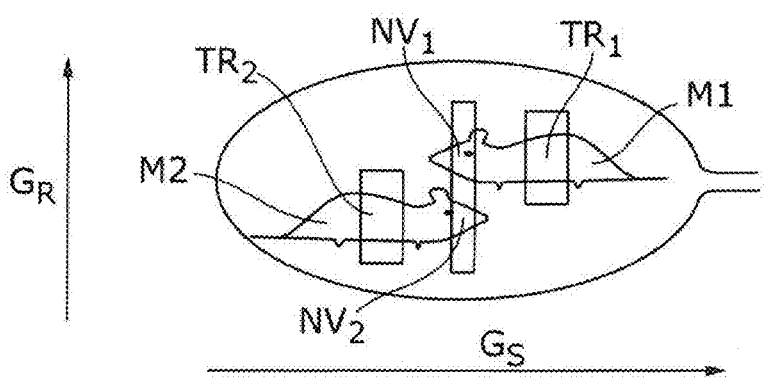
Figure 14C:
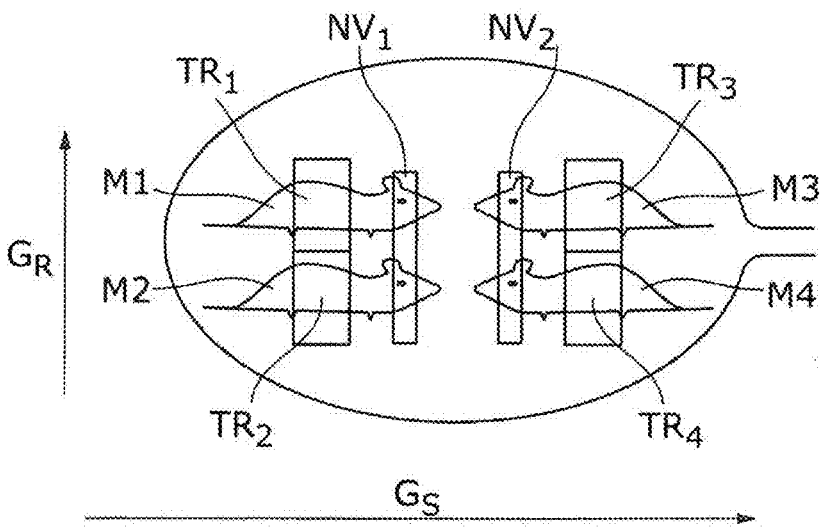

The gradient sequences shown in FIGS. 4A, 4B, 7A, 7B, 10 and 13 each comprise as second individual MR measurement for data acquisition which is different from the individual MR measurement for acquiring the navigator signals. Thus, the excitation pulse 11 for data acquisition can be chosen such that the navigator volumes do not comply with the target regions to be imaged. Specifically, navigator signals may be obtained from regions other than the target regions, but which are indicative for the motion states within the target regions (e.g. blood flow through the coronary arteries or veins is indicative for the motion state of the heart). FIGS. 14A-14C show examples where target regions TR1, TR2, TR3, TR4 to be imaged differ from the navigator volumes NV1, NV2, NV3, NV4. Nevertheless it is also possible to acquire navigator signals from the target regions. In this case the second individual measurements for acquiring image data can also be used for acquiring navigator signals.

In FIGS. 14A-14C the navigator signal for the bodies M1, M2 is obtained from both navigator volumes NV1, NV2. Thus, the imaging data of the target regions TR1, TR2 of both bodies M1, M2 can be obtained simultaneously. The same applies for the bodies M3, M4 in FIG. 14C. Specifically, in FIG. 14C, two navigator signals are acquired for determining the motion states of the four bodies M1, M2, M3, M4. The navigator signals for the bodies M1, M2 and the navigator signal for bodies M3, M4 are determined alternately, as described in the discussion of FIGS. 8A and 8B.

Figure 15A:
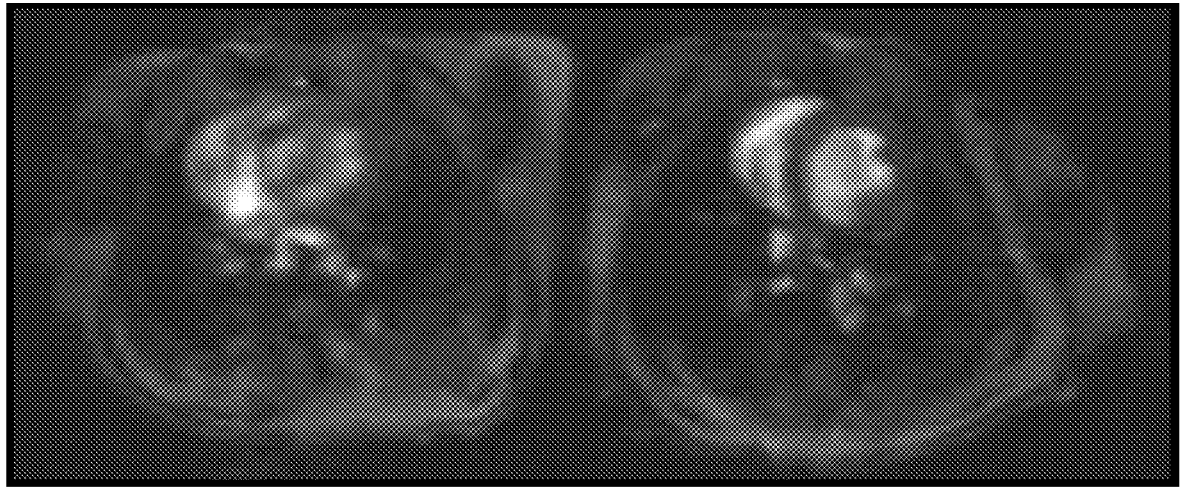
FIG. 15A shows two simultaneously imaged mice, wherein the right mouse is in motion state "end diastole".
Figure 15B:
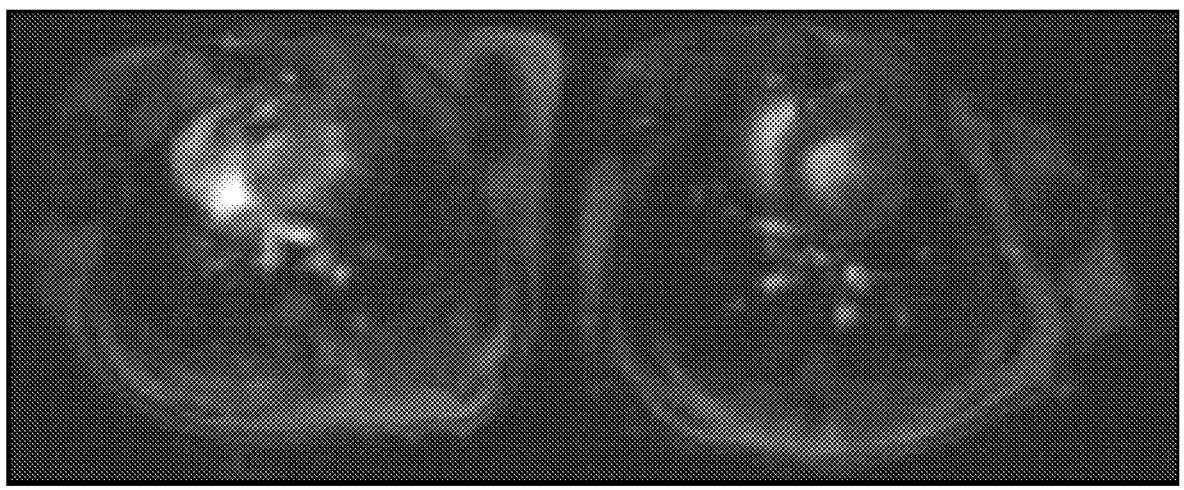
FIG. 15B shows two simultaneously imaged mice, wherein the right mouse is in motion state "end systole".

FIGS. 15A and 15B show two MR-images of two simultaneously imaged mice in each case. Each MR-image show two image regions IM1, IM2, each image region corresponding to a target region of one of the mice. In this case reconstruction of the two image regions IM1, IM2 has been carried out simultaneously, wherein the image data has been selected in dependence of the motion states of interest ("end diastole" in FIG. 15A; "end systole" in FIG. 15B) of the right mouse. Since the hearts of the two mice do not beat synchronized, the heart of the left mouse appears blurred.

In order to obtain an image in which both hearts appear sharp in a motion state of interest (e.g. both hearts in motion state "end diastole"), the reconstructions of the imaging data for the different image regions IM1, IM2 (data simultaneously acquired from the different target regions) can be carried out separately.

The present method allows determining the motion states of a multitude of bodies within an acquisition period, in which the bodies are to be examined (e.g. imaged) simultaneously.

| List of reference signs | |
| --- | --- |
| 1 | MR-device |
| 2 | RF-system |
| 3 | gradient-system |
| 4 | evaluation unit of the MR-device |
| 5 | further imaging device (e.g. PET, CT) |
| 6 | PET-detector |
| 7 | further evaluation unit (evaluation unit of the further imaging device) |
| 8 | excitation pulse (hard pulse) for acquiring a navigator signal |
| 9 | image data (here: MR-echo) |
| 9' | image data (here: FID) |
| 10, 10' | tailored RF-pulse for acquiring a navigator signal |
| 11 | excitation pulse for data acquisition |
| C | receiving coil |
| C1, C2 | surface coils |
| C3, C4 | volume coils |
| GR | read gradient |
| GS | slice selection gradient |
| M1, M2, M3, M4, M5, M6 | bodies |
| M1-M4, M2-M5, M3-M6 | second sets of bodies |
| M1-M2-M3, M4-M5-M6 | first sets of bodies |
| N1(t) | navigator signal indicative for motion state of body M1 |
| N2(t) | navigator signal indicative for motion state of body M2 |
| N12(t) | navigator signal indicative for motion states of bodies M1 and M2 |
| N123(t) | navigator signal indicative for motion states of bodies M1, M2 and M3 |
| N456(t) | navigator signal indicative for motion states of bodies M4, M5 and M6 |
| NV1, NV2, NV3, NV4 | navigator volumes |
| t1, t2, t3 | navigator times |
| TR1, TR2, TR3, TR4 | target regions |

What is claimed is:

1. A method for determining motion states of at least two bodies using a magnetic resonance (MR)-device, the bodies each having a respective target region which is in an anatomic motion comprising a repetitive motion pattern with a motion repetition rate, the method comprising:
   performing a sequence of individual MR-measurements on the bodies at respective MR-repetition rates higher than the respective motion repetition rates, wherein nuclear spins of the bodies are excited during the sequence of individual MR-measurements either simultaneously or alternately at navigator times;
   for each of the individual MR-measurements, determining navigator signals, each navigator signal indicating a motion state of at least one motion pattern at a navigator time corresponding to the navigator signal, wherein each of the navigator signals for the at least two bodies are all detected using a single common receiving coil; and determining the motion states of the bodies by analyzing the navigator signals.

2. The method according to claim 1, wherein a read gradient is applied with the individual MR-measurements and at least two of the bodies are separated along the direction of the read gradient.

3. The method according to claim 2,
wherein a slice selection gradient is applied with the individual MR-measurements,
wherein two of the bodies are offset along a direction of the slice selection gradient, and
wherein for each of the two offset bodies, an individual MR-measurement is carried out, such that the slice selection gradients of the individual MR-measurements are chosen, such that, at any of the navigator times, nuclear spins of only one of the two offset bodies are excited.

4. The method according to claim 3, wherein the individual MR-measurements for determining the navigator signals for one of the offset bodies and the individual MR-measurements for determining the navigator signals for the other offset body are carried out alternately.

5. The method according to claim 3, wherein the direction of the slice selection gradients are different for the individual MR-measurements concerning different bodies.

6. The method according to claim 3, wherein the direction of the respective slice selection gradient is different from the direction of the respective read gradient.

7. The method according to claim 1, wherein the navigator signals are part of a Free Induction Decay (FID).

8. The method according to claim 1, wherein the navigator signals are a MR-echo-signal or part of a MR-echo-signal.

9. A method for simultaneously imaging at least two bodies, the bodies each having a respective target region which is in an anatomic motion comprising a repetitive motion pattern with a motion repetition rate, the method comprising:

acquiring image data of the bodies by performing image-measurements on the bodies during an acquisition period;

determining motion states of the bodies by a magnetic resonance (MR)-device comprising:
performing, during the acquisition period, a sequence of individual MR-measurements on the bodies at respective MR-repetition rates higher than the respective motion repetition rates, wherein nuclear spins of the bodies are excited during the sequence of individual MR-measurements either simultaneously or alternately at navigator times;

for each of the individual MR-measurements, determining navigator signals, each navigator signal indicating a motion state of at least one motion pattern at a navigator time corresponding to the navigator signal, wherein each of the navigator signals for the at least two bodies are all detected using a single common receiving coil; and determining the motion states of the at least two bodies by analyzing the navigator signals;

assigning the determined motion states to image-data determined at the respective navigator times; and reconstructing one or more images from selected image-data showing one or more selected motion states.

10. The method according to claim 9, further comprising acquiring image data comprising positron emission tomography (PET)-data and generating PET-images.

11. The method according to claim 10, further comprising carrying out an interpolation between two sequential navigator times for determining an additional motion state for a point in time between the two sequential navigator times.

12. The method according to claim 10, further comprising assigning a motion state to several sequential acquisition times.

13. The method according to claim 9, further comprising acquiring image data comprising magnetic resonance imaging (MRI)-data and generating MM-images.

14. The method according to claim 4, wherein the direction of the slice selection gradient is different from the direction of the read gradient.

15. The method according to claim 5, wherein the direction of the slice selection gradient is different from the direction of the read gradient.

16. The method according to claim 1, wherein the anatomic motion is a cardiac and/or a respiratory motion.

17. The method according to claim 6, wherein the direction of the slice gradient is perpendicular to the direction of the read gradient.

18. The method according to claim 1, wherein a slice selection gradient is applied with the individual MR-measurements,
wherein two of the bodies are offset along a direction of the slice selection gradient, and
wherein for each of the two offset bodies, an individual MR-measurement is carried out, such that the slice selection gradients of the individual MR-measurements are chosen, such that, at any of the navigator times, nuclear spins of only one of the two offset bodies are excited.

* * * * *